(12) United States Patent
Darbin et al.

(10) Patent No.: US 7,760,499 B1
(45) Date of Patent: Jul. 20, 2010

(54) THERMAL MANAGEMENT SYSTEM FOR CARD CAGES

(75) Inventors: Stephen P. Darbin, Austin, TX (US); Samuel N. Heffington, Austin, TX (US); John Stanley Booth, Austin, TX (US); Raghavendran Mahalingam, Austin, TX (US)

(73) Assignee: Nuventix, Inc., Austin, TX (US)

( * ) Notice: Subject to any disclaimer, the term of this patent is extended or adjusted under 35 U.S.C. 154(b) by 0 days.

(21) Appl. No.: 12/465,645

(22) Filed: May 14, 2009

(51) Int. Cl.
*H05K 7/20* (2006.01)

(52) U.S. Cl. .................. 361/695; 361/694; 361/699; 361/719; 361/721; 174/15.1; 174/16.1; 165/80.4; 165/104.33

(58) Field of Classification Search .................. None
See application file for complete search history.

(56) References Cited

U.S. PATENT DOCUMENTS

| | | | |
|---|---|---|---|
| 6,123,145 A * | 9/2000 | Glezer et al. | 165/104.33 |
| 6,457,654 B1 * | 10/2002 | Glezer et al. | 239/4 |
| 6,588,497 B1 * | 7/2003 | Glezer et al. | 165/84 |
| 6,801,430 B1 * | 10/2004 | Pokharna | 361/695 |
| 6,937,472 B2 * | 8/2005 | Pokharna | 361/700 |
| 7,023,697 B2 * | 4/2006 | Pokharna et al. | 361/695 |
| 7,251,139 B2 * | 7/2007 | Bhattacharya et al. | 361/719 |
| 7,483,770 B2 * | 1/2009 | Meinders et al. | 700/300 |
| 7,688,583 B1 * | 3/2010 | Arik et al. | 361/694 |
| 2009/0219686 A1 * | 9/2009 | Ishikawa et al. | 361/692 |

\* cited by examiner

*Primary Examiner*—Boris L Chervinsky
(74) *Attorney, Agent, or Firm*—John A. Fortkort; Fortkort & Houston P.C.

(57) ABSTRACT

A system is provided herein which comprises (a) a plurality of circuit boards (207); (b) a plurality of slots (205), wherein each of said slots is adapted to provide power to a circuit board coupled thereto, and wherein each of said circuit boards is coupled to one of said slots; and (c) a thermal management card (209) disposed in one of said slots, said thermal management card containing at least one synthetic jet ejector.

27 Claims, 4 Drawing Sheets

THERMAL MANAGEMENT SYSTEM FOR CARD CAGES

RELATED APPLICATIONS

The present application claims priority to German Patent Application No. 10 2009 020 817.8 which was filed on May 11, 2009 (Darbin et al.), entitled "THERMAL MANAGEMENT SYSTEM FOR CARD CAGES", which claims priority to U.S. Provisional Patent Application Ser. No. 61/127, 445 (Darbin et al.), entitled "THERMAL MANAGEMENT SYSTEM FOR CARD CAGES", which was filed on May 13, 2008, and which is incorporated herein by reference in its entirety.

FIELD OF THE DISCLOSURE

The present disclosure relates generally to thermal management systems, and more particularly to card cages equipped with thermal management systems which utilize synthetic jet ejectors.

BACKGROUND OF THE DISCLOSURE

Card cages are a conventional feature in many computers and computerized systems today. Typically, card cages are racks built into a device to hold printed circuit boards and to allow these boards to be installed or removed easily.

Typically, the individual cards within a card cage must be maintained within a given temperature range to ensure optimal performance. Consequently, the thermal management of card cages is a critical aspect of the host system. In the past, fans were the conventional choice for achieving this end. However, as the circuit density of individual cards within card cages has increased, the thermal load associated with these systems has also increased. As a result, it has become increasingly challenging for thermal management systems based solely on fans to maintain the individual cards within their optimal operating temperature ranges. Moreover, as the thermal load of card cages has increased, more powerful fans are required. This is undesirable from an end user perspective, since such fans typically have a noticeably larger acoustical footprint.

SUMMARY OF THE DISCLOSURE

Figure 1:
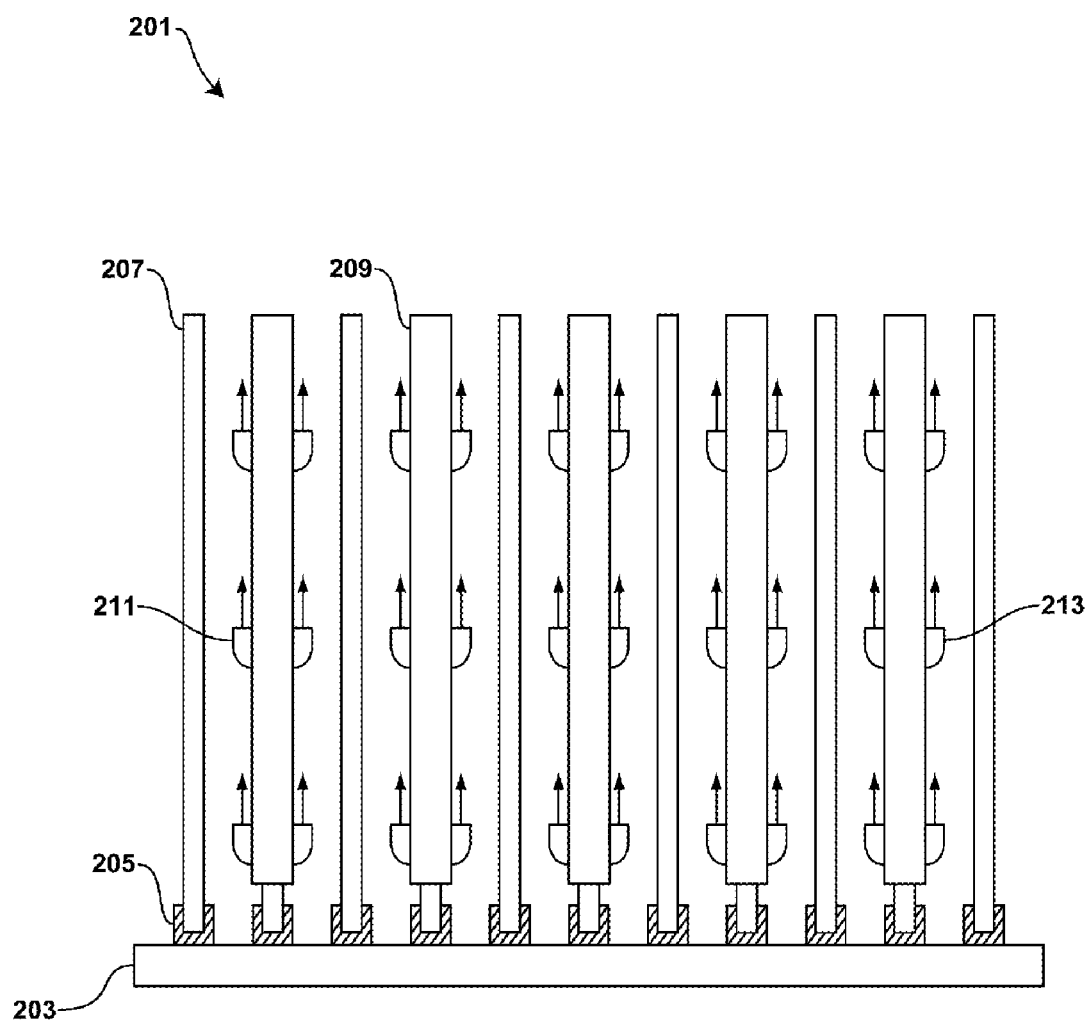
FIG. 1 is an illustration of a first particular, non-limiting embodiment of a card cage made in accordance with the teachings herein.

In one aspect, a system is provided herein which comprises (a) a plurality of circuit boards; (b) a plurality of slots, wherein each of said slots is adapted to provide power to a circuit board coupled thereto, and wherein each of said circuit boards is coupled to one of said slots; and (c) a thermal management card disposed in one of said slots, said thermal management card containing at least one synthetic jet ejector.

In another aspect, a system is provided which comprises (a) a plurality of circuit boards; (b) a plurality of slots, wherein each of said slots is adapted to provide power to a circuit board coupled thereto, and wherein each of said circuit boards is coupled to one of said slots; (c) a synthetic jet ejector; and (d) a support element for supporting said plurality of circuit boards and said plurality of slots, said support element being equipped with a plurality of apertures which are in fluidic communication with said synthetic jet ejector, and which are adapted to direct a plurality of synthetic jets onto or across the surfaces of said plurality of circuit boards.

In a further aspect, a device is provided which comprises (a) a circuit board having a first electrical connector adapted to mate with a socket, and having a second group of electrical connectors thereon; and (b) a first add-on module releasably attachable to at least one of said second group of electrical connectors, said first add-on module comprising a first synthetic jet actuator.

In still another aspect, a device is provided which comprises (a) a circuit board having a first electrical connector; and (b) a circuit board holder having a first socket adapted to mate with said first electrical connector, and having a second electrical connector adapted to mate with a second socket; wherein said circuit board holder is equipped with a first synthetic jet actuator which is in fluidic communication with a first set of nozzles.

DETAILED DESCRIPTION

It has now been found that the above noted needs may be met by providing card cages with one or more synthetic jet ejectors which are adapted to cool a surface of one or more circuit boards housed therein. This may be accomplished, for example, by providing special thermal management cards which may be inserted into one of the slots provided in the card cage which are utilized to power the circuit boards. The thermal management card may be equipped with one or more synthetic jet ejectors which run off of the power provided by the slot and which direct one or more synthetic jets onto or across a surface of an adjacent circuit board. A similar end may be accomplished, for example, by incorporating one or more fluidic pathways into the support structure of the card cage, and by equipping the support structure with apertures or nozzles at appropriate places such that, when the fluidic pathways are brought into fluidic communication with a synthetic jet actuator, synthetic jets are created at the apertures or nozzles and are directed onto or across a surface of at least one of the printed circuit boards so as to provide a thermal management function thereto.

The devices and methodologies described herein may be further appreciated with respect to the first particular, non-limiting embodiment depicted in FIG. 1. The card cage 201 depicted therein comprises a substrate 203 with a plurality of card slots 205 provided thereon. A plurality of circuit boards 207 are disposed in the card slots 205. A plurality of thermal management cards 209 are disposed in the slots in an alternating fashion with the circuit boards 207.

The thermal management cards 209 occupy one of the card slots 205 provided on the substrate 203, and are adapted to run off of the power provided by the card slot 205 though, in some variations of this embodiment, specialized slots may be provided for this purpose. As seen in FIG. 1, each of the thermal management cards 209 is equipped with a first set of synthetic jet ejectors 211 disposed on a first major surface of the thermal management card 209, and a second set of synthetic jet ejectors 213 disposed on a second major surface of the thermal management card 209. The first 211 and second 213 sets of synthetic jet ejectors are adapted to provide thermal management to circuit boards 207 disposed adjacent to the first and second major surfaces, respectively, of the thermal management card 209. The first 211 and second 213 sets of synthetic jet ejectors may accomplish this objective by directing synthetic jets onto or along the major surfaces of the circuit boards 207.

Figure 2:
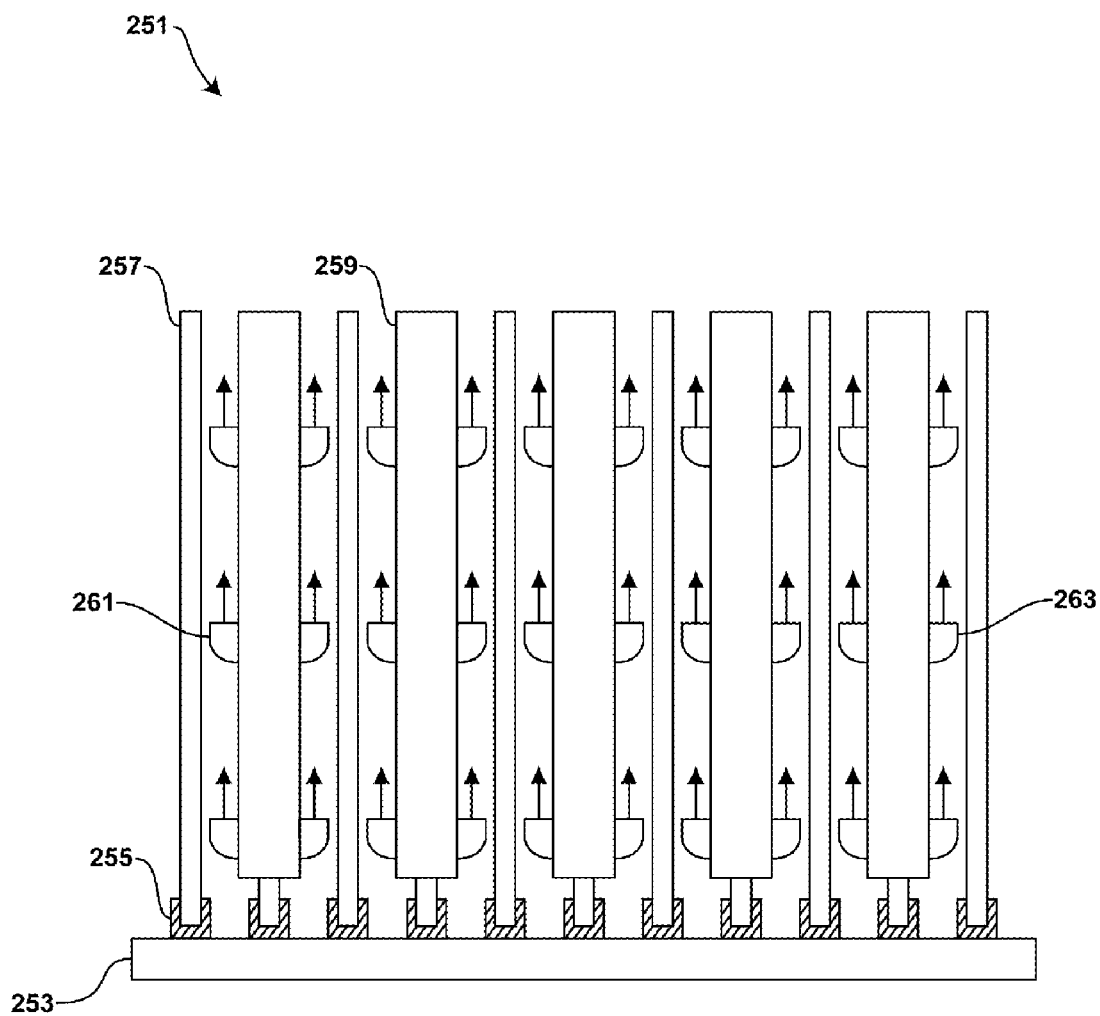
FIG. 2 is an illustration of a second particular, non-limiting embodiment of a card cage made in accordance with the teachings herein.

FIG. 2 illustrates a second particular, non-limiting embodiment of a device made in accordance with teachings herein. The card cage 251 depicted therein is identical in most respects to the embodiment depicted in FIG. 1. However, in this embodiment, the thermal management cards 259 have a thicker construction. One possible advantage of such a construction is that the synthetic jets created by the device will be closer to the surfaces of the circuit boards 257. Of course, it will be appreciated that a similar effect may be achieved by increasing the distance from which the nozzles on the thermal management card 259 protrude from the surface of the card, or by decreasing the distance between slots. It will also be appreciated that the thickness of the thermal management card 259, the distance between adjacent slots, and/or the distance from which the nozzles on the thermal management card 259 protrude from the surface of the card, may be selected to achieve the desired level of thermal management.

Various modifications of the embodiments depicted in FIGS. 1-2 are possible. For example, while these embodiments incorporate thermal management cards which emit synthetic jets from both major surfaces of the card, one skilled in the art will appreciate that embodiments are also possible in which synthetic jets are omitted from only a single surface of the card, and/or from only a portion of a surface of a card. Moreover, while the thermal management cards are depicted as being disposed of in alternating fashion with respect to the circuit boards, it will be appreciated that the thermal management cards may be deployed in any manner necessary or advantageous to achieve desired thermal management goals. Thus, for example, thermal management cards may be deployed adjacent to only those cards which require localized thermal management in addition to whatever global thermal management may be provided in the device (e.g., through the use of fans).

While the foregoing embodiments utilize discrete thermal management cards to provide thermal management for circuit boards disposed in a card cage, other configurations for the synthetic jet-based thermal management system are also possible. For example, various types of distributed thermal management systems may be employed in conjunction with card cages. These include, for example, systems of the type described in U.S. Ser. No. 11/599,603 (Mahalingam et al.), entitled "Thermal Management System for Distributed Heat Sources", and filed on Nov. 13, 2006; U.S. Ser. No. 11/601,608 (Mahalingam et al.), entitled "Synthetic Jet Ejector for the Thermal Management of PCI Cards", filed on Nov. 17, 2006; and U.S. Ser. No. 11/710,586 (Reichenbach et al.), entitled "Electronics Package for Synthetic Jet Ejectors", filed on Feb. 22, 2007; all of the foregoing of which are incorporated herein by reference in their entirety.

As a specific example of the foregoing type of embodiment, many card cages are provided with structural elements which provide support for the cards contained therein. These structural elements are typically hollow. Hence, in accordance with the teachings herein, these structural elements may be equipped with a plurality of apertures or nozzles adapted to direct a plurality of synthetic jets onto or across the surfaces of the cards disposed in the card cages, and the interior of these structural elements may be brought into fluidic communication with a synthetic jet actuator. Consequently, a distributed thermal management system may be created in which one or more remotely located synthetic jet actuators are utilized to provide a thermal management function for the card cage. In other embodiments, one or more tubes or other suitable conduits may be disposed within the structural elements to provide fluidic communication between a synthetic jet actuator and one or more nozzles or apertures, thereby achieving a similar end.

Figure 3:
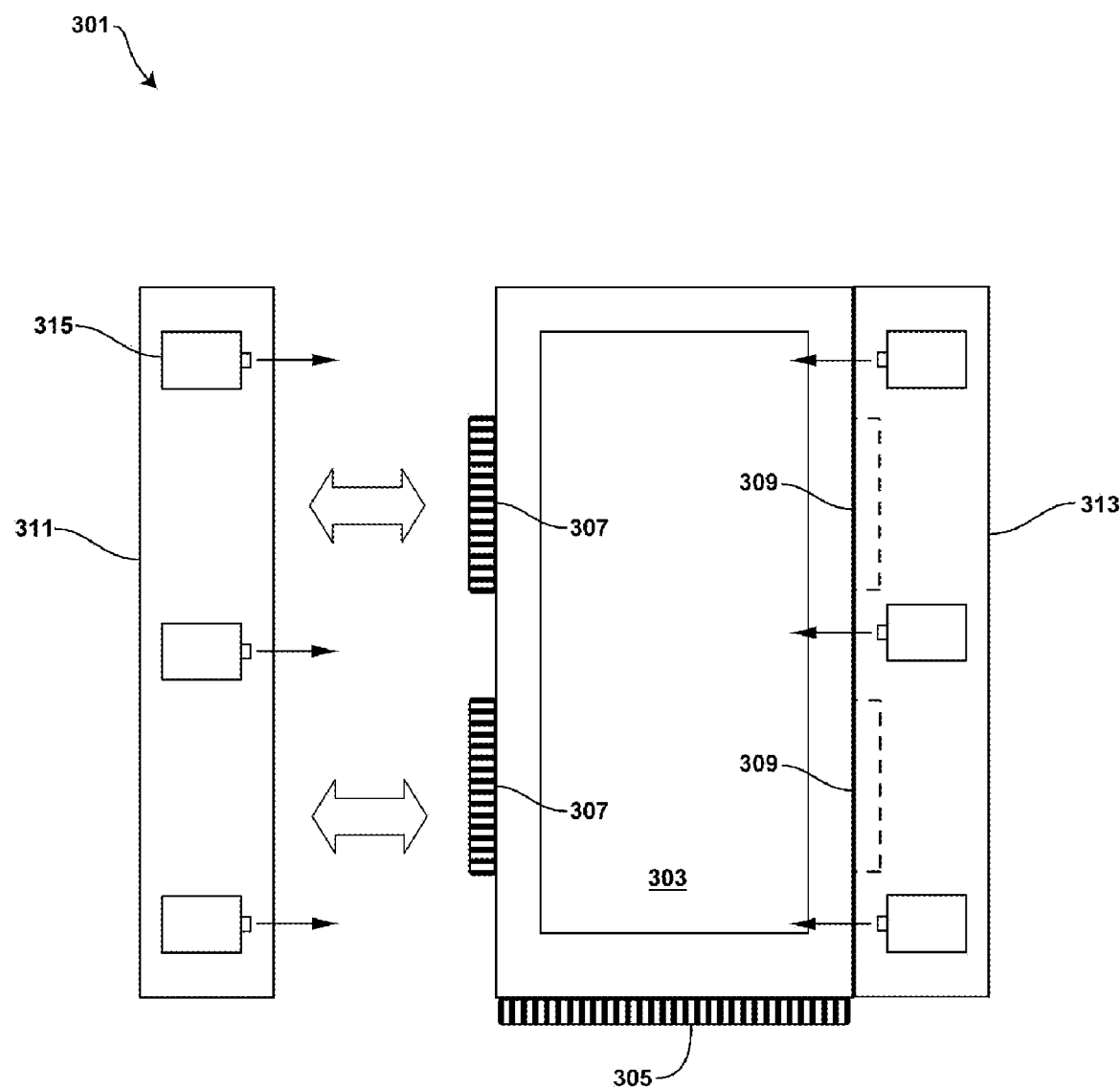
FIG. 3 is an illustration of a particular, non-limiting embodiment of an add-on synthetic jet-based card cooler made in accordance with the teachings herein.

FIG. 3 illustrates another particular, non-limiting embodiment of the present invention. In the device 301 depicted therein, a card 303 is provided which is equipped with a first connector 305 adapted to interface with a slot in a card cage (not shown), and which is further equipped with second 307 and third 309 groups of connectors arranged about the periphery of the card 303. The first connector 305 provides power to the card 303, and the second 307 and third 309 groups of connectors are adapted to interface with, and provide power to, first 311 and second 313 add-on modules, respectively. Each of the add-on modules 311, 313 is equipped with one or more synthetic jet ejectors 315 which emit one or more synthetic jets across, or onto, one or more of the surfaces of the card 303 or the features thereof. In some embodiments, the operation of the add-on modules may be controlled by the card such that, for example, the add-on modules are only activated when a certain thermal load threshold is met.

It will be appreciated that each card 303 in this embodiment may be equipped with one or two add-on modules. It will further be appreciated that embodiments are possible in accordance with the teachings herein which may feature more than two add-on modules. For example, a plurality of add-on modules may be attached to each side of the card 303.

Figure 4:
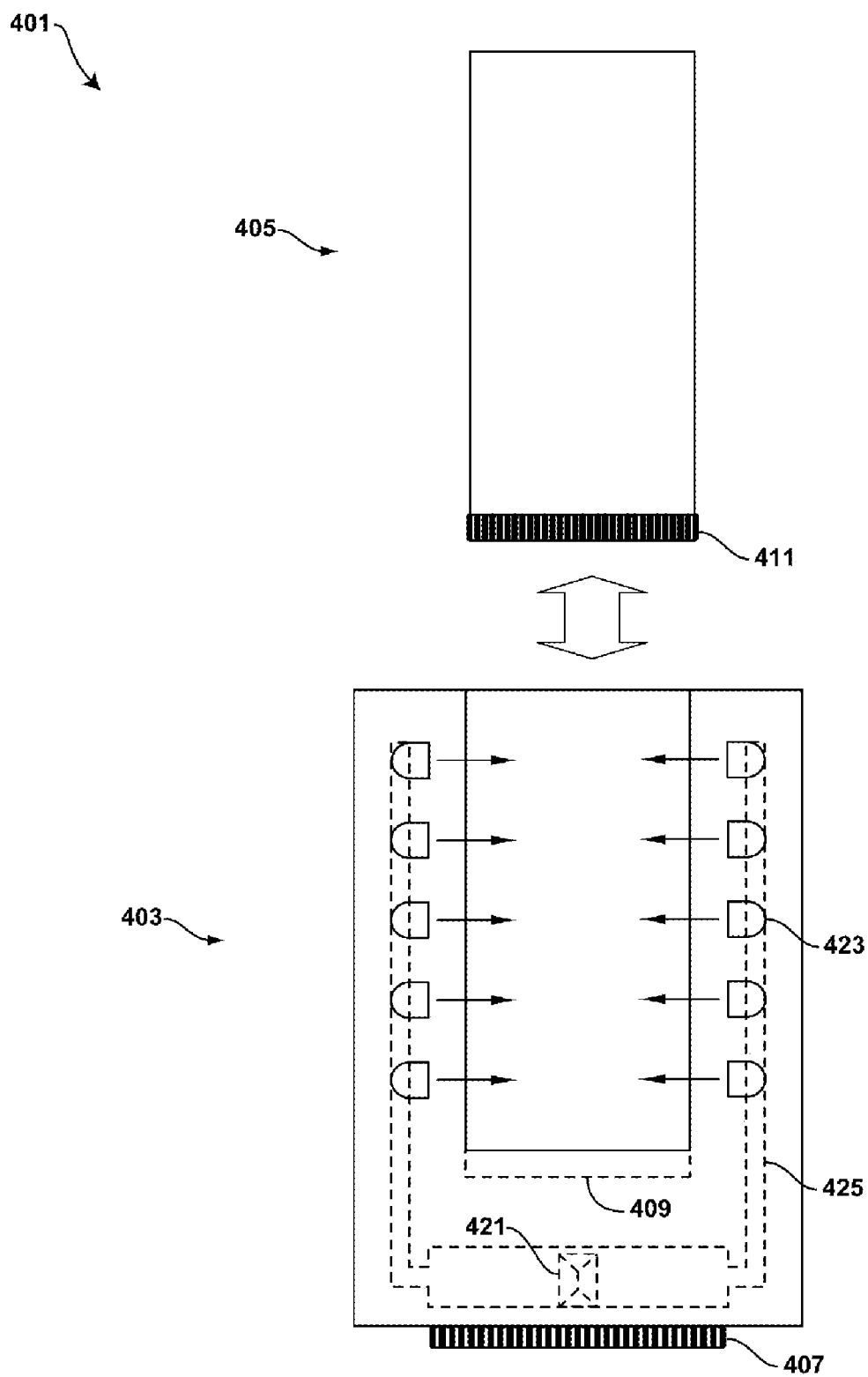
FIG. 4 is an illustration of a particular, non-limiting embodiment of an add-on synthetic jet-based card cooler made in accordance with the teachings herein.

FIG. 4 depicts a further particular, non-limiting embodiment of a device made in accordance with the teachings herein. The device 401 shown therein comprises a card holder 403 which is adapted to receive and releasably engage a card 405. The card holder 403 is provided with a first connector 407 adapted to interface with a slot in a card cage (not shown), and a suitable socket 409 to receive and releasably engage a second connector 411 provided on the card 405 such that the second connector 411 is in electrical communication with the first connector 407.

The card holder 403 is equipped with one or more built-in synthetic jet actuators 421. Actuators of this type are described in detail in, for example, U.S. 2009/0084866 (Grimm et al.) (see FIGS. 9-10), U.S. 2008/0295997 (Heffington et al.) (see FIGS. 10 and 26-31), and U.S. 2008/0009187 (Grimm et al.) (see FIGS. 6, 7, 13-16, 22, 25 and 26), each of which is included herein by reference in its entirety. The synthetic jet actuators 421 are in fluidic communication with a plurality of nozzles 423 by way of an interior channel 425. During operation of the device, the nozzles 423 emit a plurality of synthetic jets across or onto the surfaces of the card 405 and/or the features thereof. This approach allows a thermal management solution to be retrofitted into an existing card cage, or to be produced independently of the card.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A device, comprising:
   a plurality of circuit boards;

a plurality of slots, wherein each of said slots is adapted to provide power to a circuit board coupled thereto, and wherein each of said circuit boards is coupled to one of said slots; and a thermal management card disposed in one of said slots, said thermal management card containing at least one synthetic jet ejector.

2. The device of claim 1, wherein said thermal management card is adapted to cool at least one of said circuit boards.

3. The device of claim 1, wherein said plurality of circuit boards are disposed within a card cage.

4. The device of claim 1, wherein said synthetic jet ejector is adapted to run off of the power supplied by the slot the thermal management card is inserted into.

5. The device of claim 1, further comprising a plurality of thermal management cards, wherein each of said plurality of thermal management cards is disposed in one of said slots, and wherein each of said plurality of thermal management cards contains at least one synthetic jet ejector.

6. The device of claim 5, wherein any two of said plurality of circuit boards has at least one thermal management card disposed between them.

7. The device of claim 6, wherein each of said thermal management cards is adapted to direct a plurality of synthetic jets onto or across a surface of an adjacent circuit board.

8. The device of claim 7, wherein each of said thermal management cards has first and second major surfaces, wherein said first major surface is equipped with a plurality of nozzles or apertures adapted to direct a first plurality of synthetic jets across or onto a major surface of a first circuit board disposed in a first slot adjacent to the slot occupied by the thermal management card, and wherein said second surface is equipped with a second plurality of nozzles or apertures adapted to direct a second plurality of synthetic jets across or onto a major surface of a second circuit board disposed in a second slot adjacent to the slot occupied by the thermal management card.

9. The device of claim 8, wherein said first plurality of synthetic jets are created by a first synthetic jet actuator, and wherein said second plurality of synthetic jets are created by a second synthetic jet actuator.

10. The device of claim 9, wherein the first and second synthetic jet actuators are disposed within the thermal management card.

11. The device of claim 8, wherein said first and second plurality of synthetic jets are created by the same synthetic jet actuator.

12. The device of claim 11, wherein the synthetic jet actuator is disposed within the thermal management card.

13. The device of claim 1, wherein said thermal management card is thicker than any of said plurality of circuit boards, and wherein the thickness of each of the plurality of circuit boards and the thermal management card is measured along an axis which is perpendicular to a major surface of the card.

14. The device of claim 12, wherein said thermal management card has a first major surface equipped with a plurality of nozzles or apertures adapted to direct a first plurality of synthetic jets across a major surface of a first circuit board disposed in a slot adjacent to the slot occupied by the thermal management card, and wherein the thickness of the thermal management card is selected such that the cooling effect provide by the first plurality of synthetic jets is essentially optimized.

15. The device of claim 13, wherein said thermal management card has a second major surface equipped with a plurality of nozzles or apertures adapted to direct a second plurality of synthetic jets across a major surface of a second circuit board disposed in a slot adjacent to the slot occupied by the thermal management card, and wherein the thickness of the thermal management card is selected such that the cooling effect provide by the second plurality of synthetic jets is essentially optimized.

16. A device, comprising:
a plurality of circuit boards;
a plurality of slots, wherein each of said slots is adapted to provide power to a circuit board coupled thereto, and wherein each of said circuit boards is coupled to one of said slots;
a synthetic jet ejector; and
a hollow support element for supporting said plurality of circuit boards and said plurality of slots, said support element being equipped with a plurality of apertures which are in fluidic communication with said synthetic jet ejector, and which are adapted to direct a plurality of synthetic jets onto or across the surfaces of said plurality of circuit boards.

17. The device of claim 16, wherein the interior of said support element is in fluidic communication with a synthetic jet actuator.

18. A device, comprising:
a circuit board having a first electrical connector adapted to mate with a socket, and having a second group of electrical connectors thereon; and
a first add-on module releasably attachable to at least one of said second group of electrical connectors, said first add-on module comprising a first synthetic jet actuator.

19. The device of claim 18, wherein aid circuit board has a third group of electrical connectors thereon.

20. The device of claim 19, further comprising a second add-on module releasably attachable to at least one of said third group of electrical connectors, said second add-on module comprising a second synthetic jet actuator.

21. The device of claim 20, wherein said second and third group of electrical connectors are in electrical communication with said first electrical connector.

22. The device of claim 18, wherein said first add-on module comprises a first plurality of nozzles which are in fluidic communication with said first synthetic jet actuator, and wherein said first plurality of nozzles is adapted to direct a plurality of synthetic jets across or onto at least one surface of said circuit board.

23. The device of claim 22, further comprising a second add-on module releasably attachable to at least one of said third group of electrical connectors, said second add-on module comprising a second synthetic jet actuator;
wherein said second add-on module comprises a second plurality of nozzles which are in fluidic communication with said second synthetic jet actuator, and wherein said second plurality of nozzles is adapted to direct a plurality of synthetic jets across or onto at least one surface of said circuit board.

24. The device of claim 23, wherein said second and third groups of connectors are disposed on opposing sides of said circuit board.

25. A device, comprising:
a circuit board having a first electrical connector;
a circuit board holder having a first socket adapted to mate with said first electrical connector, and having a second electrical connector adapted to mate with a second socket;
wherein said circuit board holder is equipped with a first synthetic jet actuator which is in fluidic communication with a first set of nozzles.

26. The device of claim 25, wherein said circuit board holder is equipped with a second synthetic jet actuator which is in fluidic communication with a second set of nozzles.

27. The device of claim 26, wherein said first and second sets of nozzles are adapted to direct first and second sets of synthetic jets across at least one surface of said circuit board when said first socket is mated with said first electrical connector.

* * * * *